(12) United States Patent
Sheng et al.

(10) Patent No.: US 11,580,829 B2
(45) Date of Patent: Feb. 14, 2023

(54) DYNAMIC FEEDBACK FOR HAPTICS

(71) Applicant: Sentons Inc., Grand Cayman (KY)

(72) Inventors: Samuel W. Sheng, Saratoga, CA (US);
Yenyu Hsieh, San Jose, CA (US);
Mo-Hsi Edwin Su, Milpitas, CA (US);
Herbert Huang, Mountain View, CA (US)

(73) Assignee: Sentons Inc.

( * ) Notice: Subject to any disclaimer, the term of this patent is extended or adjusted under 35 U.S.C. 154(b) by 0 days.

(21) Appl. No.: 17/146,139

(22) Filed: Jan. 11, 2021

(65) Prior Publication Data
US 2021/0225138 A1     Jul. 22, 2021

Related U.S. Application Data

(63) Continuation-in-part of application No. 16/101,238, filed on Aug. 10, 2018, now Pat. No. 11,340,124.

(60) Provisional application No. 62/962,848, filed on Jan. 17, 2020, provisional application No. 62/545,391, filed on Aug. 14, 2017.

(51) Int. Cl.
*G08B 6/00* (2006.01)
*G06F 3/01* (2006.01)
*B06B 1/00* (2006.01)

(52) U.S. Cl.
CPC ............... *G08B 6/00* (2013.01); *G06F 3/016* (2013.01); *B06B 1/00* (2013.01)

(58) Field of Classification Search
CPC .. G08B 6/00; G06F 3/016; B06B 1/00; H03K 2217/96062
See application file for complete search history.

(56) References Cited

U.S. PATENT DOCUMENTS

| | | |
|---|---|---|
| 3,705,993 A | 12/1972 | Grigorovici |
| 3,912,880 A | 10/1975 | Powter |
| 4,488,000 A | 12/1984 | Glenn |
| 4,529,959 A | 7/1985 | Ito |
| 4,594,695 A | 6/1986 | Garconnat |
| 4,966,150 A | 10/1990 | Etienne |

(Continued)

FOREIGN PATENT DOCUMENTS

| | | |
|---|---|---|
| CN | 1914585 | 2/2007 |
| CN | 101133385 | 2/2008 |

(Continued)

OTHER PUBLICATIONS

Liu et al., 'Acoustic Wave Approach for Multi-Touch Tactile Sensing', Micro-NanoMechatronics and Human Science, 2009. MHS 2009. International Symposium, Nov. 9-11, 2009.

(Continued)

*Primary Examiner* — John A Tweel, Jr.
(74) *Attorney, Agent, or Firm* — Van Pelt, Yi & James LLP

(57) ABSTRACT

A haptic system is described. The haptic system includes a linear resonant actuator (LRA), a receiver, and a transmitter. The LRA has a characteristic frequency and provides a vibration in response to an input signal. The receiver is configured to sense received vibration from the LRA. The transmitter is configured to provide the input signal to the LRA. The receiver is coupled with the transmitter and provides vibrational feedback based on the received vibration. The input signal incorporates the vibrational feedback.

8 Claims, 4 Drawing Sheets

(56) References Cited

U.S. PATENT DOCUMENTS

| | | | |
|---|---|---|---|
| 5,008,497 A | 4/1991 | Asher |
| 5,074,152 A | 12/1991 | Ellner |
| 5,233,873 A | 8/1993 | Mozgowiec |
| 5,334,805 A | 8/1994 | Knowles |
| 5,451,723 A | 9/1995 | Huang |
| 5,563,849 A | 10/1996 | Hall |
| 5,573,077 A | 11/1996 | Knowles |
| 5,591,945 A | 1/1997 | Kent |
| 5,635,643 A | 6/1997 | Maji |
| 5,637,839 A | 6/1997 | Yamaguchi |
| 5,638,093 A | 6/1997 | Takahashi |
| 5,708,460 A | 1/1998 | Young |
| 5,739,479 A | 4/1998 | Davis-Cannon |
| 5,784,054 A | 7/1998 | Armstrong |
| 5,854,450 A | 12/1998 | Kent |
| 5,883,457 A | 3/1999 | Rinde |
| 5,912,659 A | 6/1999 | Rutledge |
| 6,091,406 A | 7/2000 | Kambara |
| 6,127,629 A | 10/2000 | Sooriakumar |
| 6,211,772 B1 | 4/2001 | Murakami |
| 6,232,960 B1 | 5/2001 | Goldman |
| 6,236,391 B1 | 5/2001 | Kent |
| 6,254,105 B1 | 7/2001 | Rinde |
| 6,262,946 B1 | 7/2001 | Khuri-Yakub |
| 6,307,942 B1 | 10/2001 | Azima |
| 6,473,075 B1 | 10/2002 | Gomes |
| 6,492,979 B1 | 12/2002 | Kent |
| 6,498,603 B1 | 12/2002 | Wallace |
| 6,507,772 B1 | 1/2003 | Gomes |
| 6,535,147 B1 | 3/2003 | Masters |
| 6,567,077 B2 | 5/2003 | Inoue |
| 6,630,929 B1 | 10/2003 | Adler |
| 6,633,280 B1 | 10/2003 | Matsumoto |
| 6,636,201 B1 | 10/2003 | Gomes |
| 6,788,296 B2 | 9/2004 | Ikeda |
| 6,798,403 B2 | 9/2004 | Kitada |
| 6,856,259 B1 | 2/2005 | Sharp |
| 6,891,527 B1 | 5/2005 | Chapman |
| 6,922,642 B2 | 7/2005 | Sullivan |
| 6,948,371 B2 | 9/2005 | Tanaka |
| 7,000,474 B2 | 2/2006 | Kent |
| 7,006,081 B2 | 2/2006 | Kent |
| 7,116,315 B2 | 10/2006 | Sharp |
| 7,119,800 B2 | 10/2006 | Kent |
| 7,187,369 B2 | 3/2007 | Kanbara |
| 7,193,617 B1 | 3/2007 | Kanbara |
| 7,204,148 B2 | 4/2007 | Tanaka |
| 7,218,248 B2 | 5/2007 | Kong |
| 7,274,358 B2 | 9/2007 | Kent |
| RE39,881 E | 10/2007 | Flowers |
| 7,315,336 B2 | 1/2008 | North |
| 7,345,677 B2 | 3/2008 | Ing |
| 7,411,581 B2 | 8/2008 | Hardie-Bick |
| 7,456,825 B2 | 11/2008 | Kent |
| 7,511,711 B2 | 3/2009 | Ing |
| 7,545,365 B2 | 6/2009 | Kent |
| 7,554,246 B2 | 6/2009 | Maruyama |
| 7,583,255 B2 | 9/2009 | Ing |
| 7,649,807 B2 | 1/2010 | Ing |
| 7,683,894 B2 | 3/2010 | Kent |
| 7,880,721 B2 | 2/2011 | Suzuki |
| 7,920,133 B2 | 4/2011 | Tsumura |
| 8,059,107 B2 | 11/2011 | Hill et al. |
| 8,085,124 B2 | 12/2011 | Ing |
| 8,156,809 B2* | 4/2012 | Tierling ................. G01H 13/00 |
| | | 73/579 |
| 8,194,051 B2 | 6/2012 | Wu |
| 8,228,121 B2 | 7/2012 | Benhamouda |
| 8,237,676 B2 | 8/2012 | Duheille |
| 8,319,752 B2 | 11/2012 | Hardie-Bick |
| 8,325,159 B2 | 12/2012 | Kent |
| 8,358,277 B2 | 1/2013 | Mosby |
| 8,378,974 B2 | 2/2013 | Aroyan |
| 8,392,486 B2 | 3/2013 | Ing |
| 8,418,083 B1 | 4/2013 | Lundy |
| 8,427,423 B2 | 4/2013 | Tsumura |
| 8,436,806 B2 | 5/2013 | Almalki |
| 8,436,808 B2 | 5/2013 | Chapman |
| 8,451,231 B2 | 5/2013 | Choo |
| 8,493,332 B2 | 7/2013 | D'Souza |
| 8,519,982 B2 | 8/2013 | Camp, Jr. |
| 8,576,202 B2 | 11/2013 | Tanaka |
| 8,619,063 B2 | 12/2013 | Chaine |
| 8,638,318 B2 | 1/2014 | Gao |
| 8,648,815 B2 | 2/2014 | Kent |
| 8,659,579 B2 | 2/2014 | Nadjar |
| 8,670,290 B2 | 3/2014 | Aklil |
| 8,681,128 B2 | 3/2014 | Scharff |
| 8,692,809 B2 | 4/2014 | D'Souza |
| 8,692,810 B2 | 4/2014 | Ing |
| 8,692,812 B2 | 4/2014 | Hecht |
| 8,730,213 B2 | 5/2014 | D'Souza |
| 8,749,517 B2 | 6/2014 | Aklil |
| 8,787,599 B2 | 7/2014 | Grattan |
| 8,791,899 B1 | 7/2014 | Usey |
| 8,823,685 B2 | 9/2014 | Scharff |
| 8,854,339 B2 | 10/2014 | Kent |
| 8,890,852 B2 | 11/2014 | Aroyan |
| 8,896,429 B2 | 11/2014 | Chaine |
| 8,896,564 B2 | 11/2014 | Scharff |
| 8,917,249 B1 | 12/2014 | Buuck |
| 8,941,624 B2 | 1/2015 | Kent |
| 8,946,973 B2 | 2/2015 | Pelletier |
| 8,994,696 B2 | 3/2015 | Berget |
| 9,030,436 B2 | 5/2015 | Ikeda |
| 9,041,662 B2 | 5/2015 | Harris |
| 9,046,959 B2 | 6/2015 | Schevin |
| 9,046,966 B2 | 6/2015 | D'Souza |
| 9,058,071 B2 | 6/2015 | Esteve |
| 9,099,971 B2 | 8/2015 | Lynn |
| 9,189,109 B2 | 11/2015 | Sheng |
| 9,250,742 B1 | 2/2016 | Usey |
| 9,348,468 B2 | 5/2016 | Altekar |
| 9,354,731 B1 | 5/2016 | Pance |
| 9,477,350 B2 | 10/2016 | Sheng |
| 9,594,450 B2 | 3/2017 | Lynn |
| 9,851,848 B2 | 12/2017 | Pellikka |
| 9,870,033 B1 | 1/2018 | Browning |
| 9,947,186 B2* | 4/2018 | Macours ................. G06F 3/016 |
| 9,983,718 B2 | 5/2018 | Sheng |
| 10,209,825 B2 | 2/2019 | Sheng |
| 10,466,836 B2 | 11/2019 | Sheng |
| 10,795,417 B2 | 10/2020 | Bok |
| 10,860,132 B2 | 12/2020 | Sheng |
| 11,209,916 B1 | 12/2021 | Zimmermann |
| 2001/0050677 A1 | 12/2001 | Tosaya |
| 2002/0036621 A1 | 3/2002 | Liu |
| 2002/0047833 A1 | 4/2002 | Kitada |
| 2002/0185981 A1 | 12/2002 | Dietz |
| 2003/0161484 A1 | 8/2003 | Kanamori |
| 2003/0164820 A1 | 9/2003 | Kent |
| 2003/0189745 A1 | 10/2003 | Kikuchi |
| 2003/0197691 A1 | 10/2003 | Fujiwara |
| 2003/0206162 A1 | 11/2003 | Roberts |
| 2004/0125079 A1 | 7/2004 | Kaneko |
| 2004/0133366 A1 | 7/2004 | Sullivan |
| 2004/0160421 A1 | 8/2004 | Sullivan |
| 2004/0183788 A1 | 9/2004 | Kurashima |
| 2004/0203594 A1 | 10/2004 | Kotzin |
| 2004/0239649 A1 | 12/2004 | Ludtke |
| 2004/0246239 A1 | 12/2004 | Knowles |
| 2005/0063553 A1 | 3/2005 | Ozawa |
| 2005/0146511 A1 | 7/2005 | Hill |
| 2005/0146512 A1 | 7/2005 | Hill |
| 2005/0174338 A1 | 8/2005 | Ing |
| 2005/0226455 A1 | 10/2005 | Aubauer |
| 2005/0229713 A1 | 10/2005 | Niblock |
| 2005/0248540 A1 | 11/2005 | Newton |
| 2005/0248547 A1 | 11/2005 | Kent |
| 2006/0071912 A1 | 4/2006 | Hill |
| 2006/0109261 A1 | 5/2006 | Chou |
| 2006/0114233 A1 | 6/2006 | Radivojevic |
| 2006/0132315 A1 | 6/2006 | Kurtz |
| 2006/0139339 A1 | 6/2006 | Pechman |

(56) References Cited

U.S. PATENT DOCUMENTS

| | | |
|---|---|---|
| 2006/0139340 A1 | 6/2006 | Geaghan |
| 2006/0152499 A1 | 7/2006 | Roberts |
| 2006/0166681 A1 | 7/2006 | Lohbihler |
| 2006/0197753 A1 | 9/2006 | Hotelling |
| 2006/0262088 A1 | 11/2006 | Baldo |
| 2006/0262104 A1 | 11/2006 | Sullivan |
| 2006/0279548 A1 | 12/2006 | Geaghan |
| 2006/0284841 A1 | 12/2006 | Hong |
| 2007/0019825 A1 | 1/2007 | Marumoto |
| 2007/0109274 A1 | 5/2007 | Reynolds |
| 2007/0126716 A1 | 6/2007 | Haverly |
| 2007/0165009 A1 | 7/2007 | Sakurai |
| 2007/0171212 A1 | 7/2007 | Sakurai |
| 2007/0183520 A1 | 8/2007 | Kim |
| 2007/0211022 A1 | 9/2007 | Boillot |
| 2007/0214462 A1 | 9/2007 | Boillot |
| 2007/0229479 A1 | 10/2007 | Choo |
| 2007/0236450 A1 | 10/2007 | Colgate |
| 2007/0240913 A1 | 10/2007 | Schermerhorn |
| 2007/0278896 A1 | 12/2007 | Sarkar |
| 2007/0279398 A1 | 12/2007 | Tsumura |
| 2008/0018618 A1 | 1/2008 | Hill |
| 2008/0030479 A1 | 2/2008 | Lowles |
| 2008/0062151 A1 | 3/2008 | Kent |
| 2008/0081671 A1 | 4/2008 | Wang |
| 2008/0105470 A1 | 5/2008 | Van De Ven |
| 2008/0111788 A1 | 5/2008 | Rosenberg |
| 2008/0169132 A1 | 7/2008 | Ding |
| 2008/0174565 A1 | 7/2008 | Chang |
| 2008/0198145 A1 | 8/2008 | Knowles |
| 2008/0231612 A1 | 9/2008 | Hill |
| 2008/0259030 A1 | 10/2008 | Holtzman |
| 2008/0266266 A1 | 10/2008 | Kent |
| 2008/0284755 A1 | 11/2008 | Hardie-Bick |
| 2009/0009488 A1 | 1/2009 | D'Souza |
| 2009/0103853 A1 | 4/2009 | Daniel |
| 2009/0116661 A1 | 5/2009 | Hetherington |
| 2009/0146533 A1 | 6/2009 | Leskinen |
| 2009/0160728 A1 | 6/2009 | Emrick |
| 2009/0167704 A1 | 7/2009 | Terlizzi |
| 2009/0237372 A1 | 9/2009 | Kim |
| 2009/0271004 A1 | 10/2009 | Zecchin |
| 2009/0273583 A1 | 11/2009 | Norhammar |
| 2009/0309853 A1 | 12/2009 | Hildebrandt |
| 2009/0315848 A1 | 12/2009 | Ku |
| 2010/0026667 A1 | 2/2010 | Bernstein |
| 2010/0027810 A1 | 2/2010 | Marton |
| 2010/0044121 A1 | 2/2010 | Simon |
| 2010/0045635 A1 | 2/2010 | Soo |
| 2010/0049452 A1 | 2/2010 | Suginouchi |
| 2010/0079264 A1 | 4/2010 | Hoellwarth |
| 2010/0117933 A1 | 5/2010 | Gothard |
| 2010/0117993 A1 | 5/2010 | Kent |
| 2010/0123686 A1 | 5/2010 | Klinghult |
| 2010/0126273 A1 | 5/2010 | Lim |
| 2010/0127967 A1 | 5/2010 | Graumann |
| 2010/0141408 A1 | 6/2010 | Doy |
| 2010/0156818 A1 | 6/2010 | Burrough |
| 2010/0165215 A1 | 7/2010 | Shim |
| 2010/0185989 A1 | 7/2010 | Shiplacoff |
| 2010/0188356 A1 | 7/2010 | Vu |
| 2010/0245265 A1 | 9/2010 | Sato |
| 2010/0269040 A1 | 10/2010 | Lee |
| 2010/0277431 A1 | 11/2010 | Klinghult |
| 2010/0283759 A1 | 11/2010 | Iso |
| 2010/0309139 A1 | 12/2010 | Ng |
| 2010/0311337 A1 | 12/2010 | Riviere |
| 2010/0315373 A1 | 12/2010 | Steinhauser |
| 2010/0321312 A1 | 12/2010 | Han |
| 2010/0321325 A1 | 12/2010 | Springer |
| 2010/0321337 A1 | 12/2010 | Liao |
| 2011/0001707 A1 | 1/2011 | Faubert |
| 2011/0001708 A1 | 1/2011 | Sleeman |
| 2011/0012717 A1 | 1/2011 | Pance |
| 2011/0013785 A1 | 1/2011 | Kim |
| 2011/0018695 A1 | 1/2011 | Bells |
| 2011/0025649 A1 | 2/2011 | Sheikhzadeh Nadjar |
| 2011/0042152 A1 | 2/2011 | Wu |
| 2011/0057903 A1 | 3/2011 | Yamano |
| 2011/0063228 A1 | 3/2011 | St Pierre |
| 2011/0080350 A1 | 4/2011 | Almalki |
| 2011/0084912 A1 | 4/2011 | Almalki |
| 2011/0084937 A1 | 4/2011 | Chang |
| 2011/0141052 A1 | 6/2011 | Bernstein |
| 2011/0155479 A1 | 6/2011 | Oda |
| 2011/0156967 A1 | 6/2011 | Oh |
| 2011/0167391 A1 | 7/2011 | Momeyer |
| 2011/0175813 A1 | 7/2011 | Sarwar |
| 2011/0182443 A1 | 7/2011 | Gant |
| 2011/0191680 A1 | 8/2011 | Chae |
| 2011/0199342 A1 | 8/2011 | Vartanian |
| 2011/0213223 A1 | 9/2011 | Kruglick |
| 2011/0222225 A1 | 9/2011 | Kessler |
| 2011/0222372 A1 | 9/2011 | O'Donovan |
| 2011/0225549 A1 | 9/2011 | Kim |
| 2011/0234545 A1 | 9/2011 | Tanaka |
| 2011/0248978 A1 | 10/2011 | Koyama |
| 2011/0260988 A1 | 10/2011 | Colgate |
| 2011/0260990 A1 | 10/2011 | Yassir |
| 2011/0279382 A1 | 11/2011 | Pertuit |
| 2011/0298670 A1 | 12/2011 | Jung |
| 2011/0300845 A1 | 12/2011 | Lee |
| 2011/0304577 A1 | 12/2011 | Brown |
| 2011/0316784 A1 | 12/2011 | Bisutti |
| 2011/0316790 A1 | 12/2011 | Ollila |
| 2012/0001875 A1 | 1/2012 | Li |
| 2012/0002820 A1 | 1/2012 | Leichter |
| 2012/0007837 A1 | 1/2012 | Kent |
| 2012/0026114 A1 | 2/2012 | Lee |
| 2012/0030628 A1 | 2/2012 | Lee |
| 2012/0032928 A1 | 2/2012 | Alberth |
| 2012/0050230 A1 | 3/2012 | Harris |
| 2012/0062564 A1 | 3/2012 | Miyashita |
| 2012/0068939 A1 | 3/2012 | Pemberton-Pigott |
| 2012/0068970 A1 | 3/2012 | Pemberton-Pigott |
| 2012/0081337 A1 | 4/2012 | Camp, Jr. |
| 2012/0088548 A1 | 4/2012 | Yun |
| 2012/0092964 A1 | 4/2012 | Badiey |
| 2012/0104901 A1 | 5/2012 | Jiang |
| 2012/0120031 A1 | 5/2012 | Thuillier |
| 2012/0126962 A1 | 5/2012 | Ujii |
| 2012/0127088 A1 | 5/2012 | Pance |
| 2012/0140954 A1 | 6/2012 | Ranta |
| 2012/0144293 A1 | 6/2012 | Kim |
| 2012/0149437 A1 | 6/2012 | Zurek |
| 2012/0188194 A1 | 7/2012 | Sulem |
| 2012/0188889 A1 | 7/2012 | Sambhwani |
| 2012/0194466 A1 | 8/2012 | Posamentier |
| 2012/0194483 A1 | 8/2012 | Deluca |
| 2012/0200517 A1 | 8/2012 | Nikolovski |
| 2012/0206154 A1 | 8/2012 | Pant |
| 2012/0229407 A1 | 9/2012 | Harris |
| 2012/0232834 A1 | 9/2012 | Roche |
| 2012/0235866 A1 | 9/2012 | Kim |
| 2012/0242603 A1 | 9/2012 | Engelhardt |
| 2012/0270605 A1 | 10/2012 | Garrone |
| 2012/0272089 A1 | 10/2012 | Hatfield |
| 2012/0278490 A1 | 11/2012 | Sennett |
| 2012/0280944 A1 | 11/2012 | St Pierre |
| 2012/0282944 A1 | 11/2012 | Zhao |
| 2012/0300956 A1 | 11/2012 | Horii |
| 2012/0306823 A1 | 12/2012 | Pance |
| 2013/0011144 A1 | 1/2013 | Amiri Farahani |
| 2013/0050133 A1 | 2/2013 | Brakensiek |
| 2013/0050154 A1 | 2/2013 | Guy |
| 2013/0057491 A1 | 3/2013 | Chu |
| 2013/0059532 A1 | 3/2013 | Mahanfar |
| 2013/0082970 A1 | 4/2013 | Frey |
| 2013/0127755 A1 | 5/2013 | Lynn |
| 2013/0141364 A1 | 6/2013 | Lynn |
| 2013/0141365 A1 | 6/2013 | Lynn |
| 2013/0147768 A1 | 6/2013 | Aroyan |
| 2013/0194208 A1 | 8/2013 | Miyanaka |
| 2013/0222274 A1 | 8/2013 | Mori |

(56) References Cited

U.S. PATENT DOCUMENTS

| | | |
|---|---|---|
| 2013/0234995 A1 | 9/2013 | Son |
| 2013/0249831 A1 | 9/2013 | Harris |
| 2014/0022189 A1 | 1/2014 | Sheng |
| 2014/0028576 A1 | 1/2014 | Shahparnia |
| 2014/0078070 A1 | 3/2014 | Armstrong-Muntner |
| 2014/0078086 A1 | 3/2014 | Bledsoe |
| 2014/0078109 A1 | 3/2014 | Armstrong-Muntner |
| 2014/0078112 A1 | 3/2014 | Sheng |
| 2014/0185834 A1 | 7/2014 | Frömel |
| 2014/0247230 A1 | 9/2014 | Sheng |
| 2014/0247250 A1 | 9/2014 | Sheng |
| 2014/0317722 A1 | 10/2014 | Tartz |
| 2014/0355376 A1 | 12/2014 | Schneider |
| 2014/0362055 A1 | 12/2014 | Altekar |
| 2014/0368464 A1 | 12/2014 | Singnurkar |
| 2015/0002415 A1 | 1/2015 | Lee |
| 2015/0002452 A1 | 1/2015 | Klinghult |
| 2015/0009185 A1 | 1/2015 | Shi |
| 2015/0091859 A1 | 4/2015 | Rosenberg |
| 2015/0109239 A1 | 4/2015 | Mao |
| 2015/0199035 A1 | 7/2015 | Chang |
| 2015/0253895 A1 | 9/2015 | Kim |
| 2015/0268785 A1 | 9/2015 | Lynn |
| 2015/0277617 A1 | 10/2015 | Gwin |
| 2015/0346850 A1 | 12/2015 | Vandermeijden |
| 2015/0366504 A1 | 12/2015 | Connor |
| 2016/0012348 A1 | 1/2016 | Johnson |
| 2016/0048266 A1 | 2/2016 | Smith |
| 2016/0062517 A1 | 3/2016 | Meyer |
| 2016/0070404 A1 | 3/2016 | Kerr |
| 2016/0091308 A1 | 3/2016 | Oliaei |
| 2016/0139717 A1 | 5/2016 | Filiz |
| 2016/0162044 A1 | 6/2016 | Ciou |
| 2016/0179249 A1 | 6/2016 | Ballan |
| 2016/0209944 A1 | 7/2016 | Shim |
| 2016/0216842 A1 | 7/2016 | Mölne |
| 2016/0246396 A1* | 8/2016 | Dickinson ........... G06F 3/03545 |
| 2016/0259465 A1 | 9/2016 | Agarwal |
| 2016/0282312 A1 | 9/2016 | Cable |
| 2016/0282965 A1 | 9/2016 | Jensen |
| 2016/0306481 A1 | 10/2016 | Filiz |
| 2016/0349913 A1 | 12/2016 | Lynn |
| 2016/0349922 A1 | 12/2016 | Choi |
| 2017/0010697 A1 | 1/2017 | Jiang |
| 2017/0020402 A1 | 1/2017 | Rogers |
| 2017/0024055 A1 | 1/2017 | Schwarz |
| 2017/0083164 A1 | 3/2017 | Sheng |
| 2017/0098115 A1 | 4/2017 | Wickboldt |
| 2017/0315618 A1 | 11/2017 | Ullrich |
| 2017/0322644 A1 | 11/2017 | Sahar |
| 2018/0032211 A1 | 2/2018 | King |
| 2018/0054176 A1 | 2/2018 | Kim |
| 2018/0067612 A1 | 3/2018 | Smith |
| 2018/0074638 A1 | 3/2018 | Chiang |
| 2018/0129333 A1 | 5/2018 | Zheng |
| 2018/0136770 A1 | 5/2018 | Kwong |
| 2018/0143669 A1 | 5/2018 | Bok |
| 2018/0158289 A1 | 6/2018 | Vasilev |
| 2018/0204426 A1 | 7/2018 | Nagisetty |
| 2018/0263563 A1 | 9/2018 | Mcmillen |
| 2018/0276519 A1 | 9/2018 | Benkley, III |
| 2018/0316296 A1* | 11/2018 | Hajati ........... H02P 6/16 |
| 2018/0321748 A1* | 11/2018 | Rao ........... G06F 3/016 |
| 2018/0348014 A1 | 12/2018 | Astley |
| 2019/0004622 A1 | 1/2019 | O'Brien |
| 2019/0042058 A1 | 2/2019 | Jing |
| 2019/0073064 A1 | 3/2019 | Sheng |
| 2019/0094993 A1 | 3/2019 | Kim |
| 2019/0102031 A1 | 4/2019 | Shutzberg |
| 2019/0212846 A1 | 7/2019 | Nathan |
| 2019/0383676 A1 | 12/2019 | Foughi |
| 2020/0042040 A1 | 2/2020 | Browning |
| 2020/0278747 A1 | 9/2020 | Ligtenberg |
| 2020/0310561 A1 | 10/2020 | Connellan |

FOREIGN PATENT DOCUMENTS

| | | |
|---|---|---|
| CN | 101373415 | 2/2009 |
| CN | 101568898 | 10/2009 |
| CN | 101669088 | 3/2010 |
| CN | 101978344 | 2/2011 |
| CN | 103890701 | 6/2014 |
| CN | 104169848 | 11/2014 |
| CN | 103677339 | 7/2017 |
| EP | 2315101 | 4/2011 |
| EP | 2541386 | 1/2013 |
| EP | 2315101 | 1/2014 |
| EP | 3174208 | 5/2017 |
| FR | 2948787 | 2/2011 |
| JP | 07160355 | 6/1995 |
| JP | 2005092527 | 4/2005 |
| JP | 5723499 | 5/2015 |
| KR | 20040017272 | 2/2004 |
| KR | 20070005580 | 1/2007 |
| KR | 20080005990 | 1/2008 |
| KR | 20110001839 | 1/2011 |
| WO | 03005292 | 1/2003 |
| WO | 2006131022 | 12/2006 |
| WO | 2006115947 | 6/2007 |
| WO | 2009028680 | 3/2009 |
| WO | 2011010037 | 1/2011 |
| WO | 2011024434 | 3/2011 |
| WO | 2011048433 | 4/2011 |
| WO | 2011051722 | 5/2011 |
| WO | 2012010912 | 1/2012 |
| WO | 2013135252 | 9/2013 |
| WO | 2014066621 | 6/2014 |
| WO | 2014209757 | 12/2014 |
| WO | 2015027017 | 2/2015 |
| WO | 2015127167 | 8/2015 |
| WO | 2019094440 | 5/2019 |

OTHER PUBLICATIONS

Mir et al: "Built-in-self-test techniques for MEMS", Microelectronics Journal, Mackintosh Publications Ltd. Luton, GB, vol. 37, No. 12, Dec. 1, 2006 (Dec. 1, 2006), pp. 1591-1597, XP028078995, ISSN: 0026-2692, DOI: 10.1016/J.MEJO.2006.04.016 [retrieved on Dec. 1, 2006].

T Benedict et al. 'The joint estimation of signal and noise from the sum envelope.' IEEE Transactions on Information Theory 13.3, pp. 447-454. Jul. 1, 1967.

* cited by examiner

DYNAMIC FEEDBACK FOR HAPTICS

CROSS REFERENCE TO OTHER APPLICATIONS

This application claims priority to U.S. Provisional Patent Application No. 62/962,848 entitled DYNAMIC FEEDBACK FOR HAPTICS filed Jan. 17, 2020 which is incorporated herein by reference for all purposes.

This application is a continuation in part of U.S. patent application Ser. No. 16/101,238 entitled PIEZORESISTIVE SENSOR filed Aug. 10, 2018, which is claims priority to U.S. Provisional Patent Application No. 62/545,391 entitled PIEZORESISTIVE SENSOR filed Aug. 14, 2017, both of which are incorporated herein by reference for all purposes.

BACKGROUND OF THE INVENTION

Mobile devices, such as smart phones, are increasingly desired to provide a haptic response to users. Linear resonant actuators (LRAs) are frequently utilized to provide this haptic response. However, depending upon the driving frequency for the LRA, the haptic response of an LRA may be too small for use in a mobile device. Further, the desired characteristics of the haptic response from the LRA may be difficult to achieve. Consequently, an improved mechanism for providing a haptic response, particularly in a mobile device, is desired.

BRIEF DESCRIPTION OF THE DRAWINGS

Various embodiments of the invention are disclosed in the following detailed description and the accompanying drawings.

DETAILED DESCRIPTION

Figure 1:
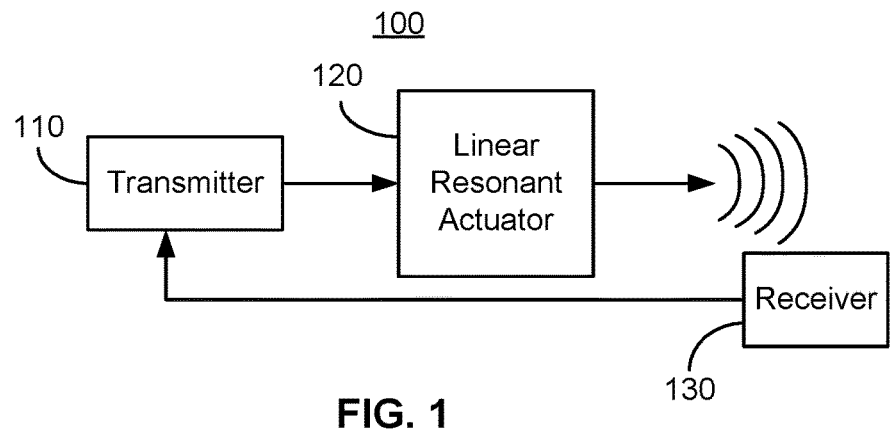
FIG. 1 is a diagram depicting an exemplary embodiment of a system for haptics including a linear resonant actuator and incorporating vibrational feedback.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Mobile devices, such as smart phones, are increasingly desired to provide a haptic response to users. Linear resonant actuators (LRAs) are frequently utilized to provide this haptic response. An LRA utilizes a spring-mass system having a resonant frequency at or near $\sqrt{k/m}$, where k is the stiffness (e.g. Hooke's constant) of the spring and m is the mass attached to the spring. In order to drive the spring-mass system, currents and electromagnetic fields are used. In some cases, the mass is magnetic. The mass vibrates in response to a nearby changing current, for example a current driven through a voice coil. Alternatively, a current may be driven through a spring wound around a magnetic core. In such cases, the spring vibrates, which causes the mass to move. If the LRA is driven at or near the resonant frequency, the amplitude of displacement of the mass may be sufficient to provide the desired haptic response. If the LRA is not driven at resonance, the mass may exhibit little movement and a small haptic response may be output. Thus, the haptic response of an LRA may be too small for use in a mobile device.

The LRA is also generally desired to output a particular haptic response profile. For example, the haptic response may be desired to have an amplitude versus time profile similar to a square pulse. Such a response may provide the user with the feel of the click of a button. Because of the frequency response of the LRA, however, the input signal used to achieve the desired haptic response may be complicated. For example, an input current pulse that is a square wave generally does not result in a mass displacement versus time that is also a substantially square wave.

To provide a haptic response, the LRA is calibrated. Calibration typically occurs during manufacture of the mobile or other device incorporating the LRA. During this calibration phase, the appropriate and typically complex input signal for the desired haptic response is determined. This input signal is then subsequently used to drive the LRA. Although calibrating the LRA may initially provide the desired haptic response, the appropriate input signal may drift based on aging of the mobile device, add-ons such as mobile device cases, the characteristics of the user and other attributes. Consequently, an improved mechanism for providing a haptic response is desired.

A mechanism for providing a haptic response is described. In some embodiments, a haptic system including an LRA, a receiver and a transmitter is provided. The haptic system may be incorporated into a mobile device or other device for which a haptic response is desired. The LRA has a characteristic frequency (e.g. a resonant frequency) and provides a vibration in response to an input signal. The receiver senses received vibration from the LRA. In some embodiments, the receiver may be a piezoelectric receiver. In some such embodiments, the piezoelectric receiver may also be operated as a touch sensor. The transmitter provides the input signal to the LRA. The receiver is coupled with the transmitter and provides vibrational feedback based on the received vibration. The input signal provided by the transmitter incorporates the vibrational feedback. In some embodiments, the haptic system includes a current sensor and a voltage sensor. The current sensor is coupled with the transmitter and senses a transmitter output current corresponding to the input signal. The voltage sensor is coupled with the transmitter and senses a transmitter output voltage corresponding to the input signal. Feedback for the transmitter includes the vibrational feedback, the transmitter output voltage and the transmitter output current. In some embodiments, a processor is coupled with the receiver, the current sensor and the voltage sensor. The processor provides for the transmitter a driving signal incorporating the feedback. For example, the processor may provide a difference between a desired haptic response and the received vibrations. The current and voltage sensors may be used to prevent the LRA from being overdriven.

A method for providing a haptic response is also described. The method includes sensing a received vibration from an LRA having a characteristic frequency. The LRA provides a vibration in response to an input signal. Feedback for a transmitter is provided. The feedback includes vibrational feedback based on the received vibration. The received vibration(s) may be sensed using a piezoelectric receiver. The transmitter provides the input signal to the LRA. The input signal incorporates the vibrational feedback. This correction of the input signal using vibrational feedback may be carried out dynamically during use in order to generate an input signal that results in the desired vibrations from the LRA and, therefore, the desired haptic response.

In some embodiments, the method includes detecting a user-generated input and initially providing the input signal in response to the user-generated input. In some embodiments, the method includes sensing a transmitter output current corresponding to the input signal and sensing a transmitter output voltage corresponding to the input signal. Providing the feedback for the transmitter may thus include providing the vibrational feedback, providing the transmitter output voltage and providing the transmitter output current. In some embodiments, a driving signal incorporating the feedback is provided to the transmitter.

Figure 2:
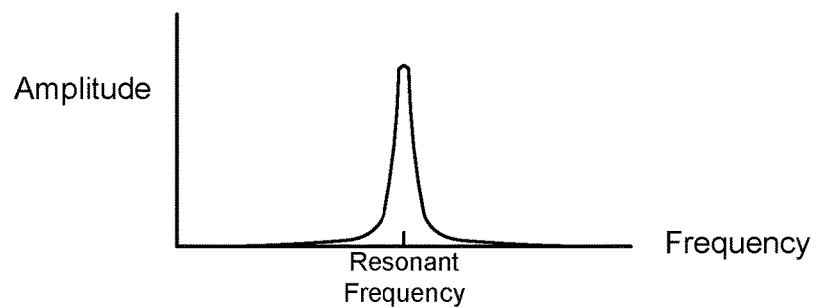
FIG. 2 is a diagram depicting an exemplary embodiment of the frequency response of a linear resonant actuator.

FIG. 1 is a diagram depicting an exemplary embodiment of haptic system 100 usable in a device such as a mobile device. For clarity, only certain components are shown and FIG. 1 is not to scale. The haptic system includes at least one transmitter 110, at least one linear resonant actuator (LRA) 120, and at least one receiver 130. In the embodiment shown in FIG. 1, haptic system includes one transmitter 110, one LRA 120 and one receiver 130. LRA 120 has a characteristic frequency (e.g. a resonant frequency) and provides a vibration in response to an input signal. An embodiment of the frequency response of LRA 120 is depicted in FIG. 2. The resonant frequency of LRA 120 may be at least five Hertz and not more than five hundred Hertz in some embodiments. For example, the resonant frequency may be two hundred Hertz.

In operation, transmitter 110 sends an input signal to LRA 120 to drive LRA 120. LRA 120 responds and provides initial output vibrations. The vibrations from LRA 120 propagate through the device in which haptic system 100 is incorporated. Receiver 130 senses received vibrations from LRA 120. In some embodiments, receiver 130 is a piezoelectric receiver. In some such embodiments, piezoelectric receiver 130 may also be operated (e.g. simultaneously) as a touch sensor. When operated as a touch sensor, piezoelectric receiver 130 may be driven by a signal. However, when used in connection with haptic system 100, receiver 130 may be considered to be used as a microphone. In response to a received vibration, receiver 130 provides vibrational feedback (feedback based on the received vibrations) for transmitter 110. More specifically, amplitude of the response, the envelope of the response and the phase may be sensed using receiver 130 and returned as vibrational feedback. In the embodiment shown, receiver 130 provides the vibrational feedback directly to transmitter 110. In other embodiments, the vibrational feedback is processed before being incorporated into a signal provided to transmitter 110. For example, the response of receiver 130 may be proportional to the received vibrations. The feedback provided to transmitter 110 may be based on a difference between the desired haptic response and the received vibrations. This feedback is incorporated into a (new) input signal provided by transmitter 110 to LRA 120. The new input signal should result in (new) haptic response by LRA 120 that is closer to the desired haptic response. Thus, the haptic response of LRA 120 is adjusted based upon the received vibrations at receiver 130 and the desired haptic response. In some embodiments, these adjustments may be performed algorithmically by a linear adaptive filter or equalizer. Consequently, the desired haptic response may be achieved.

In some embodiments, haptic system 100 is used as part of a streamlined calibration mechanism during or after production. Consequently, each mobile device incorporating a haptic system may be individually calibrated. Further, haptic system 100 may be used in real time during actual usage of the corresponding device. In such an embodiment, haptic system 100 may dynamically adjust output of LRA 120 in real time. In such embodiments, haptic system 100 may account for differences in users, cases, wear, temperature and/or other issues that may otherwise reduce the haptic response from what is desired. Thus, using vibrational feedback, haptic system 100 may improve the haptic response in a mobile device.

Figure 3:
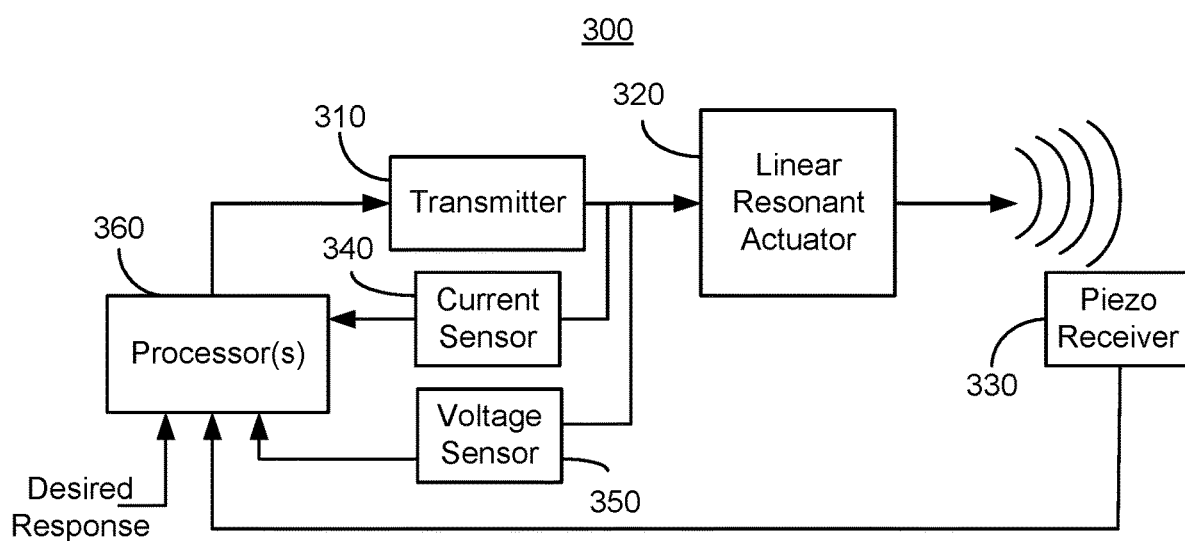
FIG. 3 is a diagram depicting another exemplary embodiment of dynamic feedback system for haptics including a linear resonant actuator.

FIG. 3 is a diagram depicting an exemplary embodiment of haptic system 300 usable in a device such as a mobile device. For clarity, only certain components are shown and FIG. 3 is not to scale. The haptic system includes at least one transmitter 310, at least one linear resonant actuator (LRA) 320, and at least one receiver 330. In the embodiment shown in FIG. 3, haptic system includes one transmitter 310, one LRA 320 and one receiver 330. Receiver 330 is a piezoelectric receiver. In some such embodiments, piezoelectric receiver 330 may also be operated as a touch sensor. In some embodiments, the resonant frequency of LRA 320 is at least 5 Hz and not more than 300 Hz. In such embodiments, the wavelength(s) of vibrations for LRA 320 are such that the location of piezoelectric receiver 330 in a smaller mobile device such as a smart phone is not important in providing vibrational feedback. However, in some embodiments, piezoelectric receiver 330 is desired to have a specific location, such as a desired location for a particular haptic response. Transmitter 310, LRA 320 and receiver 330 are analogous to transmitter 110, LRA 120 and receiver 130, respectively. In addition, haptic system 300 includes at least one current sensor 340, at least one voltage sensor 350 and one or more processors 360. For simplicity, only one current sensor 340, one voltage sensor 350 and one processor 360 are separately depicted.

Haptic system 300 functions in an analogous manner to haptic system 100. Transmitter 310 sends an input signal to LRA 320 to drive LRA 320. Current sensor 340 and voltage sensor 350 sense the current and voltage for the input signal. LRA 320 responds and provides initial output vibrations. The vibrations from LRA 320 propagate through the device in which haptic system 300 is incorporated. Piezoelectric receiver 330 senses received vibrations from LRA 320. In response to a received vibration, piezoelectric receiver 330 provides vibrational feedback (feedback based on the received vibrations) for transmitter 310. The vibrational feedback may simply be a measure of the received vibrations. Thus, piezoelectric receiver 330 functions in an analogous manner to receiver 130. This vibrational feedback is provided to processor 360 and/or other logic (not shown). Processor 360 may operate on the vibrational feedback, for example calculating a difference between the received vibrations and the desired haptic response, which may be input as shown in FIG. 3. This difference is used to provide a driving signal to transmitter 310.

Processor 360 also receives from sensors 340 and 350 current and voltage feedback related to the input signal for LRA 320. Feedback from current sensor 340 and voltage sensor 350 may be used to ensure that LRA 320 is not overdriven. For example, processor 360 may limit or reduce the gain on signals input to transmitter 310. Processor 360 provides a new driving signal to transmitter 310. The new driving signal provided to transmitter 310 may be a combination of the previously provided signal, the vibrational feedback (e.g. a difference between the desired haptic response and the received vibrations from piezoelectric receiver 330), and any changes due to the sensed current and voltage. Transmitter 310 then provides a new input signal to LRA 320.

Figure 4A:
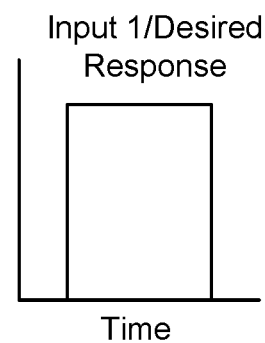
FIGS. 4A-4D are diagrams depicting exemplary embodiments of signals for of a linear resonant actuator incorporating vibrational feedback as incorporated in a mobile device.
Figure 4B:
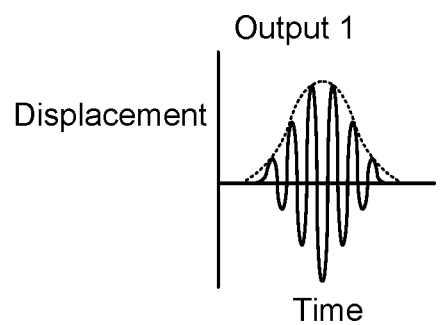
Figure 4C:
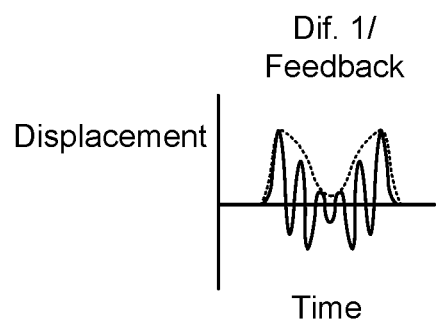
Figure 4D:
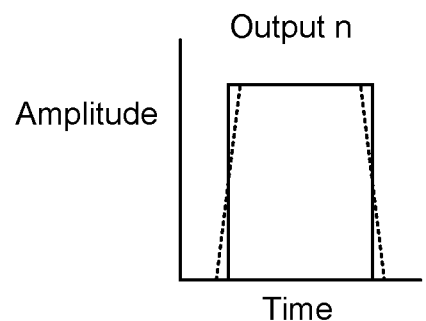

For example, FIGS. 4A-4D depict various signals during operation of haptic system 300. FIG. 4A depicts the desired envelope of the haptic response. An input signal having the same shape may also be provided from transmitter 310 to LRA 320 as an initial driving signal. The initial output of LRA 320 is shown in FIG. 4B, with the envelope indicated by a dashed line. Thus, a mass in LRA 320 oscillates at or near the resonant frequency of LRA 320. Piezoelectric receiver 330 senses the vibrations and provides this vibrational feedback to processor 360. Processor 360 determines the difference between the desired haptic response and the vibrational feedback/received vibrations from piezoelectric receiver 430. This difference is shown in FIG. 4C, with the envelope indicated by a dashed line. In addition, the sensed current and voltage for the signal driving LRA 320 are provided to processor 360, which determines whether to reduce the gain to transmitter 310. Processor 360 to transmitter 310 provides a control signal that takes into account the previous driving signal (e.g. FIG. 4A), vibrational feedback (e.g. the difference in FIG. 4C), current feedback and voltage feedback. Transmitter 310 provides an updated input signal to LRA 320. This updated input signal incorporates the previous driving signal, vibrational feedback from piezoelectric receiver 330, current feedback and voltage feedback. This process continues during operation. FIG. 4D depicts an embodiment of the envelope of the (eventual) output of LRA 320. Thus, LRA 320 is driven to provide a haptic response analogous to the desired form shown in FIG. 4A. FIG. 4D also depicts a dashed line indicating the haptic response having a finite slope. Such a response may reduce spiking of current and/or voltage.

Thus, haptic system 300 may be used as part of a streamlined calibration mechanism during production and/or in real time during use of the device in which haptic system 300 is incorporated. Consequently, each mobile device incorporating a haptic system may be individually calibrated. Further, haptic system 300 may dynamically adjust output of LRA 320 in real time. In such embodiments, haptic system 300 may account for differences in users, cases, wear, temperature and/or other issues that may otherwise reduce the haptic response from what is desired. Consequently, the haptic response in the device incorporating haptic system 300 may be improved.

Figure 5:
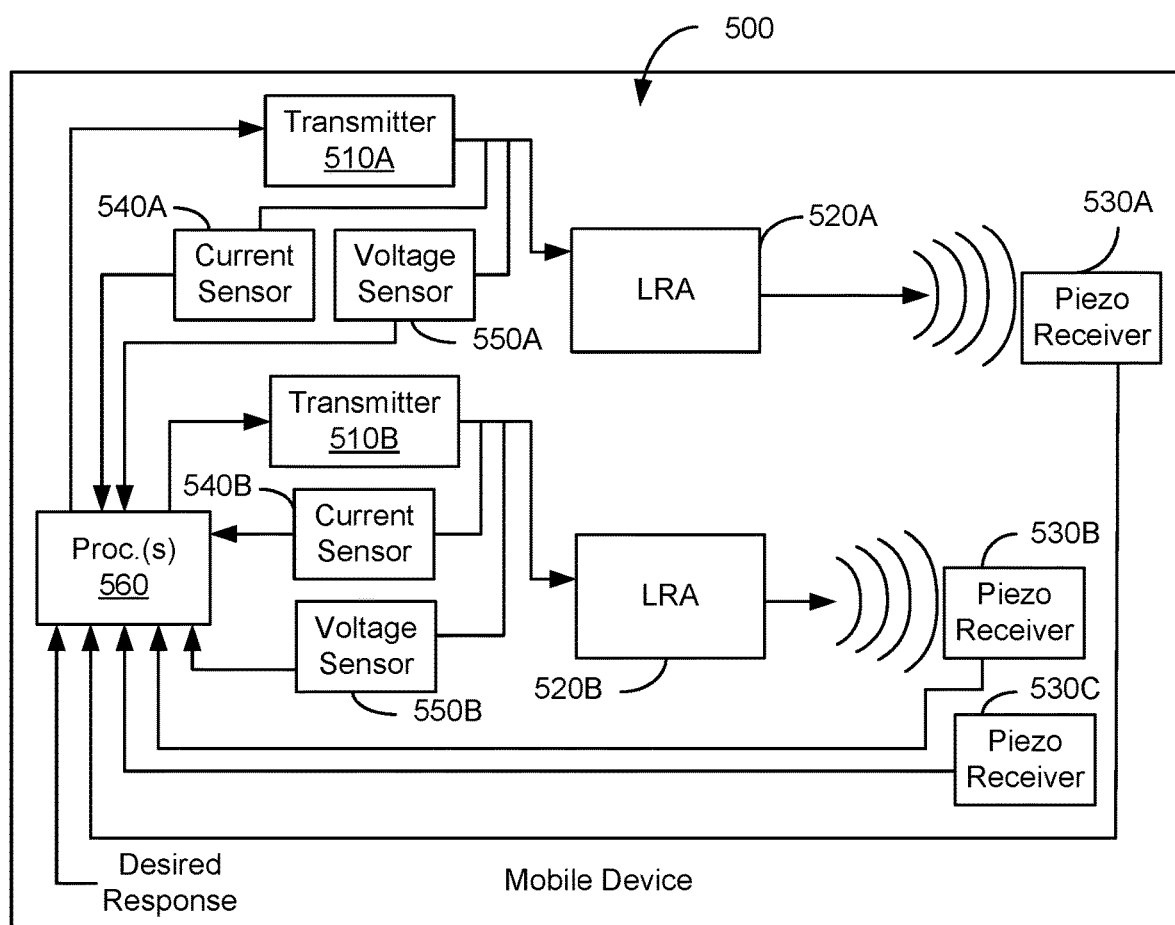
FIG. 5 is a diagram depicting an exemplary embodiment of the dynamic frequency response of a linear resonant actuator incorporating vibrational feedback.

FIG. 5 is a diagram depicting an exemplary embodiment of haptic system 500 usable in a device such as a mobile device. For clarity, only certain components are shown and FIG. 5 is not to scale. The haptic system includes at least one transmitter 510, at least one linear resonant actuator (LRA) 520, at least one receiver 530, current sensor(s) 540, voltage sensor(s) 550 and processor(s) 560. In the embodiment shown in FIG. 5, haptic system includes two transmitters 510A and 510B (collectively or generically transmitter(s) 510), two LRAs 520A and 520B (collectively or generically LRA(s) 520) and receivers 530A, 530B and 530C (collectively receivers 530). Receivers 530 are piezoelectric receivers. Transmitter 510, LRAs 520 and receivers 530 are analogous to transmitter 110/310, LRA 120/320 and receiver 130/330, respectively. Current sensor(s) 540A and 540B (collectively or generically current sensor(s) 540), voltage sensor(s) 550A and 550B (collectively or generically voltage sensor(s) 550) and processor(s) 560 are analogous to current sensor(s) 340, voltage sensor(s) 350 and processor(s) 360. Although separate current sensors 540 and voltage sensors 550 are shown as sensing current and voltage output by transmitters 510 to each LRA 520A and 520B, in some embodiments, shared current sensors and voltage sensors may be used for both LRAs 520. Haptic system 500 functions in an analogous manner to and may provide benefits analogous to haptic system 100 and/or 300. However, as indicated in FIG. 5, multiple LRAs 520 are driven (e.g. at their individual resonant frequency) and multiple piezoelectric receivers 530 sense the output of LRAs 520.

Figure 6:
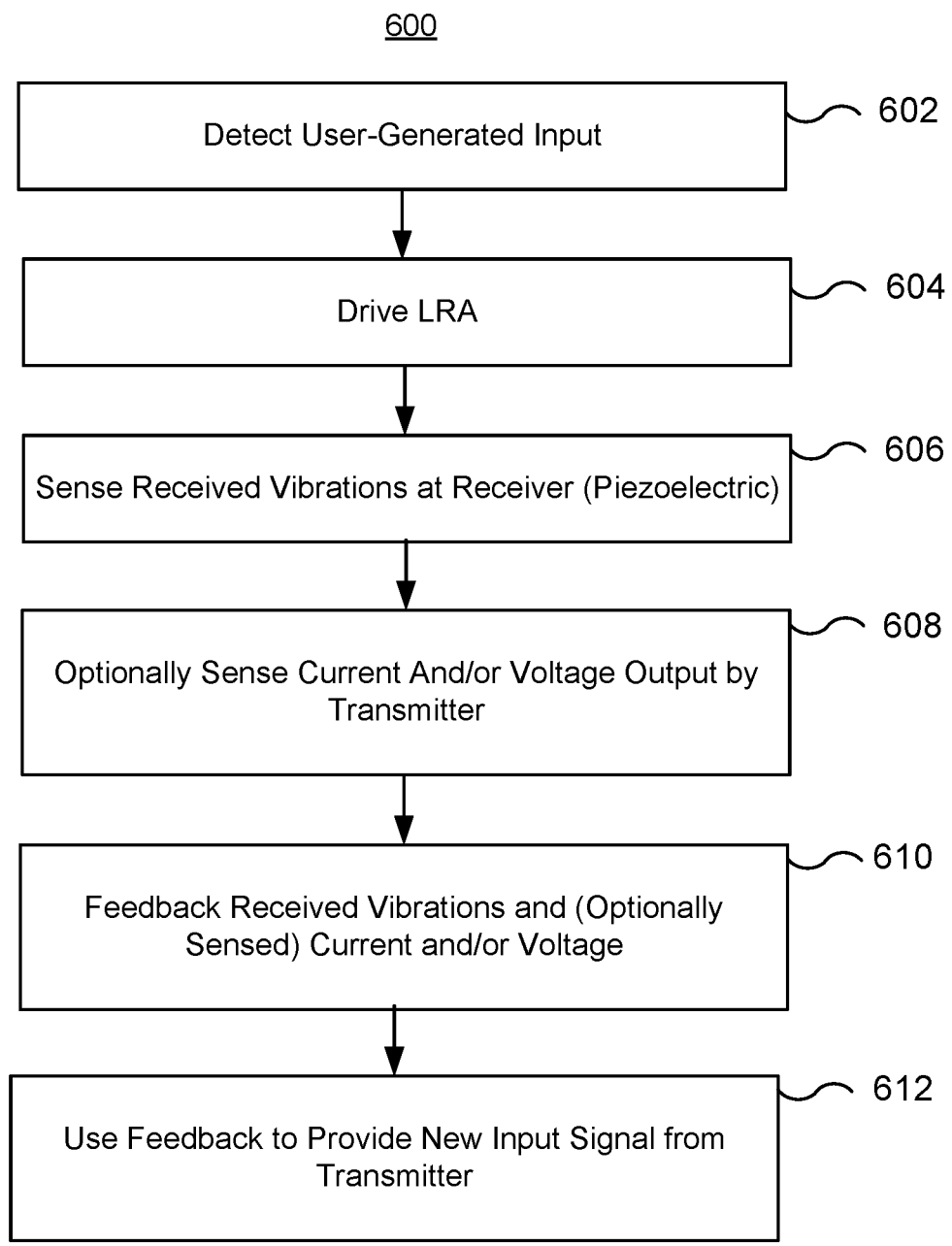
FIG. 6 is a flow chart depicting an exemplary embodiment of a method for providing a haptic response utilizing a linear resonant actuator incorporating vibrational feedback.

FIG. 6 is a flow chart depicting an exemplary embodiment of method 600 for using a haptic system having vibrational feedback. Method 600 may include steps that are not depicted for simplicity. Method 600 is described in the context of haptic system 300. However, method 600 may be used with other haptic systems including but not limited to systems 100 and 500.

User-generated input may be detected, at 602. For example, at 602 a user pressing a portion of the mobile device may be detected. In response, LRA 320 is driven, at 604. This may include transmitter 310 providing a driving signal to LRA 320. Receiver 330 senses received vibrations and provides vibrational feedback, at 606. Current and/or voltage may optionally be sensed by current sensor 340 and voltage sensor 350, at 608. Feedback incorporating the received vibrations and, optionally, sensed current and voltage is provided, at 610. In some embodiments, this feedback is provided to processor 360. The feedback is used to adjust the driving current, at 612. For example, the magnitude, frequency and/or phase may be adjusted for transmitter 310 may be tuned at 612. Similarly, the magnitude, frequency and/or phase (e.g. relative phase) for transmitters 510 may be adjusted at 612. This process continues during operation to provide the desired haptic response. Thus, the haptic response of a device may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A haptic system, comprising:
   a linear resonant actuator (LRA) having a characteristic frequency and providing a vibration in response to an input signal;
   a receiver configured to sense received vibration from the LRA;
   a current sensor coupled with the transmitter and configured to sense a transmitter output current corresponding to the input signal;
   a voltage sensor coupled with the transmitter and configured to sense a transmitter output voltage corresponding to the input signal; and
   a transmitter configured to provide the input signal to the LRA, the receiver being coupled with the transmitter and providing vibrational feedback based on the received vibration, the input signal incorporating the vibrational feedback;
   wherein feedback for the transmitter includes the vibrational feedback, the transmitter output voltage and the transmitter output current.

2. The haptic system of claim 1, further comprising
   a processor coupled with the receiver, the current sensor and the voltage sensor, the processor configured to provide for the transmitter a driving signal incorporating the feedback.

3. The haptic system of claim 1, wherein the receiver is a piezoelectric receiver.

4. The haptic system of claim 3, wherein the haptic system is incorporated into a mobile device.

5. A method, comprising:
   sensing a received vibration from a linear resonant actuator (LRA) having a characteristic frequency, the LRA providing a vibration in response to an input signal;
   providing feedback for a transmitter, the feedback including vibrational feedback based on the received vibration;
   sensing a transmitter output current corresponding to the input signal;
   sensing a transmitter output voltage corresponding to the input signal; and
   providing from the transmitter the input signal to the LRA, the input signal incorporating the vibrational feedback;
   wherein the providing the feedback for the transmitter includes providing the vibrational feedback, providing the transmitter output voltage and providing the transmitter output current.

6. The method of claim 5, further comprising providing for the transmitter a driving signal incorporating the feedback.

7. The method of claim 5, wherein the sensing further includes:
   sensing the at least one received vibration using a piezoelectric receiver.

8. The method of claim 5, further comprising:
   detecting a user-generated input; and
   initially providing the input signal in response to the user-generated input.

* * * * *